United States Patent
Chidambarrao et al.

(10) Patent No.: US 7,655,972 B2
(45) Date of Patent: Feb. 2, 2010

(54) STRUCTURE AND METHOD FOR MOSFET WITH REDUCED EXTENSION RESISTANCE

(75) Inventors: Dureseti Chidambarrao, Weston, CT (US); Carl Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/164,378

(22) Filed: Nov. 21, 2005

(65) Prior Publication Data

US 2007/0114611 A1    May 24, 2007

(51) Int. Cl.
 *H01L 29/94* (2006.01)
(52) U.S. Cl. .............................. 257/327; 257/E21.619
(58) Field of Classification Search ................ 438/655, 438/630, 649; 257/377, 327, E21.619
See application file for complete search history.

(56) References Cited

U.S. PATENT DOCUMENTS

| | | | |
|---|---|---|---|
| 4,692,349 A | | 9/1987 | Georgiou et al. |
| 4,873,557 A | * | 10/1989 | Kita ............................ 257/344 |
| 4,877,644 A | | 10/1989 | Wu et al. |
| 5,260,108 A | | 11/1993 | Braren et al. |
| 6,025,620 A | | 2/2000 | Kimura et al. |
| 6,063,681 A | * | 5/2000 | Son .............................. 438/303 |
| 6,180,469 B1 | | 1/2001 | Pramanick et al. |
| 6,369,429 B1 | | 4/2002 | Pramanick et al. |
| 6,399,467 B1 | * | 6/2002 | Erhardt et al. ............... 438/592 |
| 6,787,422 B2 | * | 9/2004 | Ang et al. .................... 438/296 |
| 6,908,847 B2 | * | 6/2005 | Saito et al. ................... 438/627 |
| 2002/0109196 A1 | | 8/2002 | Fujisawa et al. |
| 2003/0162359 A1 | | 8/2003 | Yang et al. |
| 2003/0183881 A1 | * | 10/2003 | Lee et al. ..................... 257/382 |
| 2003/0218209 A1 | | 11/2003 | D'Anna et al. |
| 2004/0089878 A1 | | 5/2004 | Takehashi et al. |

OTHER PUBLICATIONS

"Circuit Repair Using Palladium Seeding and Selective Electroless Plating," Vigliotti, DR et al., IBM Technical Disclosure Bulletin, v37 n6B Jun. 1994 p. 443-444.
"Development of Photoexcited Surface Modification Technology Utilizing Modulator Radiation," Y. Tsutsui et al., Sumitomo Electric Industries Tech. Rev. (Japan), No. 45, Jan. 1998, p. 169-74.

* cited by examiner

*Primary Examiner*—Bradley K Smith
*Assistant Examiner*—Amar Movva
(74) *Attorney, Agent, or Firm*—Scully, Scott, Murphy & Presser, P.C.; Joseph P. Abate, Esq.

(57) ABSTRACT

The present invention provides a method in which a low-resistance connection between the MOS channel and silicided source/drain regions is provided that has an independence from the extension ion implant process as well as device overlap capacitance. The method of the present invention broadly includes selectively removing outer spacers of an MOS structure and then selectively plating a metallic or intermetallic material on exposed portions of a semiconductor substrate that were previously protected by the outer spacers. The present invention also provides a semiconductor structure that is formed utilizing the method. The semiconductor structure includes a low-resistance connection between the silicided source/drain regions and the channel regions which includes a selectively plated metallic or intermetallic material.

16 Claims, 4 Drawing Sheets

STRUCTURE AND METHOD FOR MOSFET WITH REDUCED EXTENSION RESISTANCE

FIELD OF THE INVENTION

The present invention relates to a semiconductor structure and a method of fabricating the same. More particularly, the present invention relates to a semiconductor structure that has a low-resistance extension connection (on the order of less than 50 ohms/square, preferably from about 2 to about 30 ohms/square; prior art values are typically from about 50 to about 500 ohms/square) between the channel of a metal oxide semiconductor field effect transistor (MOSFET) and silicided source/drain regions with an independence from extension implants and device overlap (i.e., Miller) capacitance. The present invention also provides a method of fabricating such a semiconductor structure in which portions of the source/drain extension regions located between the silicided source/drain regions and the channel are selectively plated with a metallic or intermetallic material.

BACKGROUND OF THE INVENTION

Field effect transistors (FETs) are the basic building block of today's integrated circuit. Such transistors can be formed in conventional bulk substrates (such as silicon) or in semiconductor-on-insulator (SOI) substrates.

State of the art metal oxide semiconductor (MOS) transistors are fabricated by depositing a gate stack material over a gate dielectric and a substrate. Generally, the MOS transistor fabrication process implements lithography and etching processes to define the conductive, e.g., poly-Si, Si, gate structures. The gate structure and substrate are thermally oxidized, and, after this, source/drain extensions are formed by implantation. Sometimes the implant is performed using a spacer to create a specific distance between the gate and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. The deep source/drain implants are then performed with the thick spacer present. High temperature anneals are performed to activate the junctions after which the source/drain and top portion of the gate are generally silicided. Silicide formation typically requires that a refractory metal be deposited on a Si-containing substrate followed by a high temperature thermal anneal process to produce the silicide material. The silicide process forms low resistivity contacts to the deep source/drain regions and the gate conductor.

In order to be able to make integrated circuits (ICs), such as memory, logic, and other devices, of higher integration density than currently feasible, one has to find a way to further downscale the dimensions of field effect transistors (FETs), such as metal oxide semiconductors. The downscaling of transistor dimensions allows for improved performance as well as compactness, but such downscaling has some device degrading effects. Generational improvements for high performance MOS devices are obtained by decreasing the transistor line width, reducing the gate oxide thickness, and decreasing the source/drain extension resistance. Smaller transistor line width results in less distance between the source and the drain. This results in faster switching speeds for complementary metal oxide semiconductor (CMOS) circuits. However, as the transistor line width gets smaller, the overall area available for silicidation is reduced. This means that as transistor line width shrinks, line resistance (i.e., series resistance) is increased. Increased line resistance causes degradation in device performance.

Source/drain extension resistance is another important performance factor. Drive currents may be increased by reducing source/drain extension resistance. Increasing the source/drain extension dose leads to lower resistance but has an undesirable side effect of increasing the junction depth.

As such, there is a need for providing a semiconductor structure having a low-resistance extension connection between the channel and the silicided source/drain regions with an independence from extension implants and device overlap (i.e., Miller) capacitance. Miller capacitance, which can also be referred to as the gate-drain or gate-source capacitance, increases the capacitance by a factor related to the voltage gain of a transistor.

SUMMARY OF THE INVENTION

The present invention provides a method in which a low-resistance connection between the device channel and silicided source/drain regions is provided that has an independence from the extension ion implant process as well as device overlap capacitance. The method of the present invention broadly includes selectively removing outer spacers of an MOS structure and then selectively plating a metallic or intermetallic material on exposed portions of a semiconductor substrate that were previously protected by the outer spacers. The exposed portions are located between the silicided source/drain regions and the channel region (or the edge of the gate conductor).

In general terms, the method of the present invention comprises:

providing a MOS structure that at includes at least one gate region located on a surface of a semiconductor substrate, said at least one gate region comprising source/drain regions and source/drain extension regions in said semiconductor substrate that are separated by a channel region, a gate dielectric and a gate conductor located above said channel region, an offset spacer located on sidewalls of at least said gate conductor and an outer spacer adjacent to said offset spacer and silicide contacts located atop the source/drain regions adjacent said outer spacer;

removing said outer spacer to expose a surface portion of the semiconductor substrate including said source/drain extension regions; and selectively plating a metallic or intermetallic material on said exposed surface portion of said semiconductor substrate including said source/drain extension regions.

In addition to the method, the present invention also relates to a semiconductor structure that is formed utilizing the method described above. In broad terms, the semiconductor structure includes a low-resistance connection between the silicided source/drain regions and the channel region which includes a selectively plated metallic or intermetallic material. By "low-resistance" it is meant a connection that has a resistivity on the order of less than 50 ohms/square, with about 2 to about 30 ohms/square being more typical. In the prior art, the resistance is typically about 50 to about 500 ohms/square, thus the present invention represents an improvement over prior art structures.

In general terms, the semiconductor structure comprises:

a semiconductor substrate including source/drain extension regions and a channel region located between said source/drain extension regions;

a gate dielectric and a gate conductor located above the channel region and positioned on a surface of said semiconductor substrate, said gate dielectric and said gate conductor having vertical edges that are covered by an offset spacer; and silicide source/drain contacts, wherein said silicide source/drain contacts are spaced apart from said channel region by a metallic or intermetallic material that is located on the surface of said semiconductor substrate including said source/drain extension regions.

The term "silicided source/drain contacts" is used herein to denote the portions of the source/drain regions that have been silicided by a conventional salicidation process.

DETAILED DESCRIPTION OF THE INVENTION

The present invention, which provides a method for fabricating a semiconductor structure having reduced extension resistance and the resultant structure formed by the method, will now be described in greater detail by referring to the following discussion and drawings that accompany the present application. It is noted that the drawings of the present application are provided for illustrative purposes and, as such, they are not drawn to scale.

Figure 1:
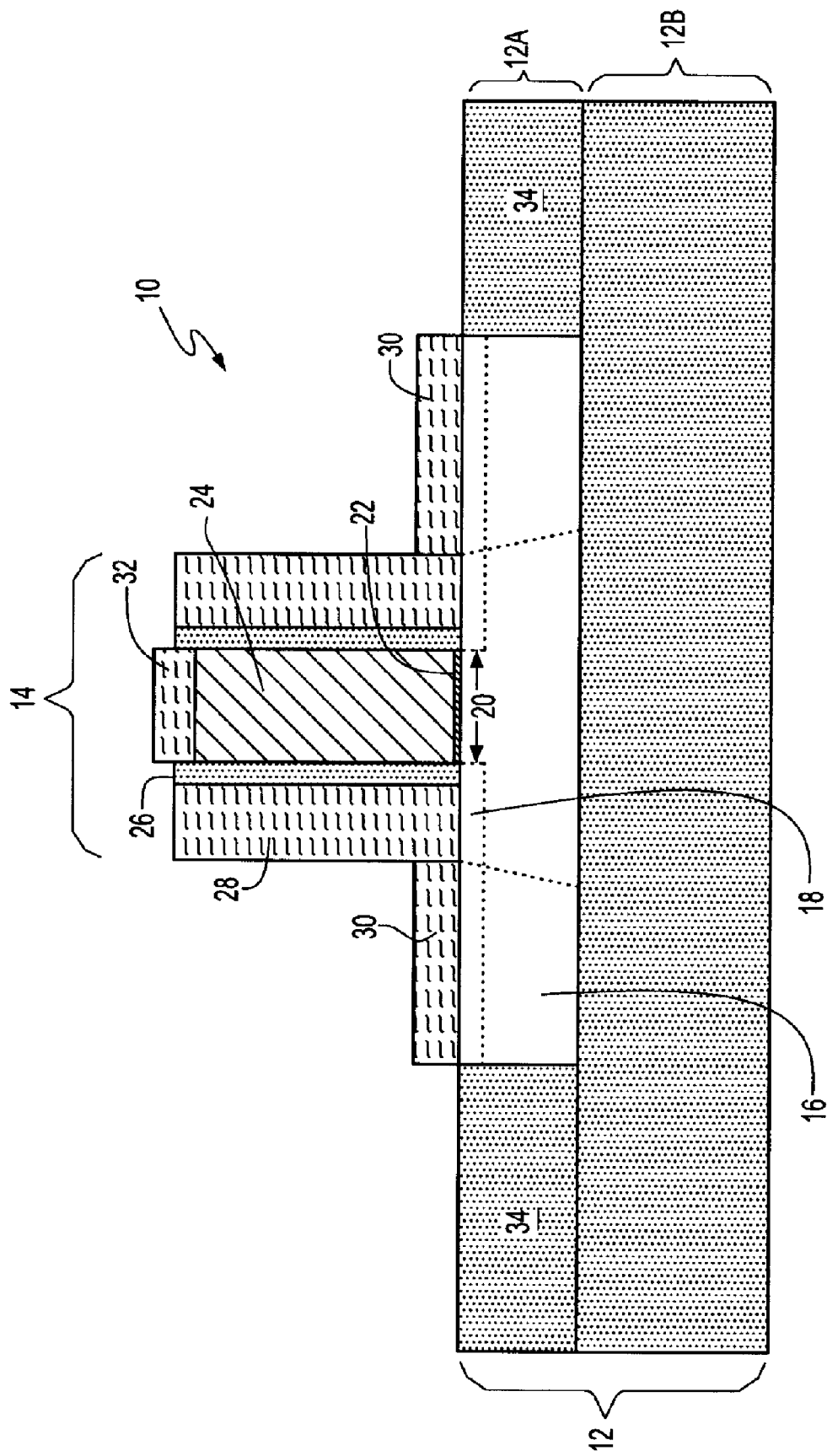
FIGS. 1 is a pictorial representation (through a cross sectional view) depicting an initial MOS structure that is used in the present invention.

FIG. 1 illustrates an initial MOS structure 10 that is employed in the present invention. As illustrated, the initial MOS structure 10 includes a semiconductor substrate 12 that has at least one gate region 14. The at least one gate region 14 includes source/drain regions 16, source/drain extension regions 18, a channel region 20, a gate dielectric 22 and a gate conductor 24. As shown, the source/drain extension regions 18 are separated from each other by the channel region 20. Also, as shown, the gate dielectric 22 and the gate conductor 24 are located atop the channel region 20 on a surface of the semiconductor substrate 12. The gate region 14 also includes a pair of spacers, including an inner (i.e., offset) spacer 26 and an outer spacer 28. The inner spacer 26 is located on sidewalls of at least the gate conductor 24. The at least one gate region 14 also includes a silicide region 30 located atop the source/drain regions 16 and an optional silicide region 32 atop the gate conductor 24. The initial structure 10 also includes trench isolation regions 34 that are located in the semiconductor substrate 12.

It is noted that the at least one gate region 14 is provided for illustrative purposes and thus the present invention is not limited to only a single gate region. Instead, the present invention works when the substrate includes a plurality of gate regions. The plurality of gate regions may have the same or different conductivities, i.e., n-FETs, p-FETs or a combination of n-FETs and p-FETs.

The initial structure 10 is formed utilizing conventional CMOS processing techniques and materials well-known in the art. For example, the semiconductor substrate 12 of the initial structure 10 comprises any semiconducting material including, but not limited to: Si, Ge, SiGe, SiC, SiGeC, Ga, GaAs, InAs, InP and all other III/V compound semiconductors. Semiconductor substrate 12 may also comprise an organic semiconductor or a layered semiconductor such as Si/SiGe, or a semiconductor-on-insulator (SOI). In some embodiments of the present invention, it is preferred that the semiconductor substrate 12 be composed of a Si-containing semiconductor material, i.e., a semiconductor material that includes silicon. The semiconductor substrate 12 may be doped, undoped or contain doped and undoped regions therein.

When SOI substrates are used such as shown in FIG. 1, the SOI substrate includes a top semiconductor layer 12A, an insulating layer 12B, and a bottom semiconductor layer (not shown in the drawings). The insulating layer 12B, which comprises a crystalline or non-crystalline oxide or nitride, separates the top semiconductor layer from the bottom semiconductor layer. When SOI substrates are used, the trench isolation regions 34 may, in some embodiments, extend down to the surface of the buried insulating layer that separates the top semiconductor layer from the bottom semiconductor layer. In yet other embodiments, the trench isolation regions 34 do not extend to the surface of the buried insulating layer.

The semiconductor substrate 12 may also include a first doped (n- or p-) region, and a second doped (n- or p-) region. For clarity, the doped regions are not specifically labeled in the drawings of the present application. The first doped region and the second doped region may be the same, or they may have different conductivities and/or doping concentrations. These doped regions are known as "wells".

It is also noted that the semiconductor substrate 12 may be strained, unstrained or contain strained regions and unstrained regions therein. The semiconductor substrate 12 may also have a single crystal orientation or alternatively, the substrate 12 may be a hybrid semiconductor substrate that has surfaces having different crystallographic orientations.

Trench isolation regions 34 are formed in the semiconductor substrate 12 prior to well formation utilizing conventional processes well known to those skilled in the art. The trench isolation regions 34 are typically formed utilizing trench isolation techniques that are well known in the art including, for example, forming a patterned mask on the surface of the substrate via lithography, etching a trench into the substrate thru an opening in the patterned mask, filling the trench with a trench dielectric such as $SiO_2$ or TEOS and planarizing the structure. An optional trench liner can be formed within the trench prior to trench dielectric fill and an optional densification step may follow the planarization process.

Prior to forming the gate dielectric 22, the surface of substrate 12 is cleaned to remove any residual layers (e.g., native oxide), foreign particles, and any residual metallic surface contamination and to temporarily protect the cleaned substrate surface. Any residual silicon oxide is first removed in a solution of hydrofluoric acid. The preferred removal of particles and residual metallic contamination is based on the industry standard gate dielectric preclean known as RCA clean. The RCA clean includes a treatment of the substrate 12 in a solution of ammonium hydroxide ($NH_4OH$) and hydrogen peroxide ($H_2O_2$) followed by an aqueous mixture of hydrochloric acid and an oxidizing agent (e.g., $H_2O_2$, $O_3$). As a result, the cleaned substrate surface is sealed with a very thin layer of chemical oxide (not shown). While the protective chemical oxide is typically made thinner than about 10 Å so to not interfere with the properties of gate dielectric 22, its thickness can be varied to beneficially alter properties of the gate dielectric 22.

A blanket layer of gate dielectric 22 is formed on the entire surface of the structure 10 including the semiconductor substrate 12 and atop the isolation region 34, if it is present and, if it is a deposited dielectric. The gate dielectric 22 can be formed by a thermal growing process such as, for example, oxidation. Alternatively, the gate dielectric 22 can be formed by a deposition process such as, for example, chemical vapor deposition (CVD), plasma-assisted CVD, atomic layer or pulsed deposition (ALD or ALPD), evaporation, reactive sputtering, chemical solution deposition or other like deposition processes. The gate dielectric 22 may also be formed utilizing any combination of the above processes.

The gate dielectric 22 is comprised of an insulating material having a dielectric constant of about 4.0 or greater, preferably greater than 7.0. The dielectric constants mentioned herein are relative to a vacuum, unless otherwise stated. Note that $SiO_2$ typically has a dielectric constant that is about 4.0. Specifically, the gate dielectric 22 employed in the present invention includes, but is not limited to: an oxide, nitride, oxynitride and/or silicates including metal silicates, aluminates, titanates and nitrides. In one embodiment, it is preferred that the gate dielectric 22 is comprised of an oxide such as, for example, $SiO_2$, $HfO_2$, $ZrO_2$, $Al_2O_3$, $TiO_2$, $La_2O_3$, $SrTiO_3$, $LaAlO_3$, $Y_2O_3$ and mixtures thereof.

The physical thickness of the gate dielectric 22 may vary, but typically, the gate dielectric 22 has a thickness from about 0.5 to about 10 nm, with a thickness from about 0.5 to about 2 nm being more typical.

After forming the gate dielectric 22, a blanket layer of polysilicon or another gate conductor material or combination thereof, which becomes the gate conductor 24 shown in FIG. 1, is formed on the gate dielectric 22 utilizing a known deposition process such as, for example, physical vapor deposition, CVD or evaporation. The blanket layer of gate conductor material may be doped or undoped. If doped, an in-situ doping deposition process may be employed in forming the same. Alternatively, a doped gate conductor layer can be formed by deposition, ion implantation and annealing. The doping of the gate conductor layer will shift the workfunction of the gate formed. Illustrative examples of dopant ions include As, P, B, Sb, Bi, In, Al, Ga, TI or mixtures thereof. Typical doses for the ion implants are 1E14 ($=1\times10^{14}$) to 1E16 ($=1\times10^{16}$) atoms/cm$^2$ or more typically 1E15 to 5E15 atoms/cm$^2$. The thickness, i.e., height, of the gate conductor 24 deposited at this point of the present invention may vary depending on the deposition process employed. Typically, the gate conductor 24 has a vertical thickness from about 20 to about 180 nm, with a thickness from about 40 to about 150 nm being more typical.

The gate conductor 24 can comprise any conductive material that is typically employed as a gate of a CMOS structure. Illustrative examples of such conductive materials that can be employed as the gate conductor 24 include, but are not limited to: polysilicon, conductive metals or conductive metal alloys, conductive silicides, conductive nitrides, polySiGe and combinations thereof, including multilayers thereof. In some embodiments, it is possible to form a barrier layer between multiple layers of gate conductors.

An optional dielectric cap (not shown) can be formed atop the gate conductor 24 at this point of the present invention. The optional dielectric cap is typically removed before or immediately after the source/drain regions to be subsequently formed have been silicided.

The blanket gate conductor 24 and the gate dielectric 22 are then patterned by lithography and etching so as to provide at least one patterned gate stack. When a plurality of patterned gate stacks are present, the patterned gate stacks may have the same dimension, i.e., length, or they can have variable dimensions to improve device performance. Each patterned gate stack at this point of the present invention includes at least the gate conductor 24 and the gate dielectric 22. The lithography step includes applying a photoresist to the upper surface of the gate conductor 24, exposing the photoresist to a desired pattern of radiation and developing the exposed photoresist utilizing a conventional resist developer. The pattern in the photoresist is then transferred to the blanket layer of gate conductor 24 and the gate dielectric 22 utilizing one or more dry etching steps. In some embodiments, the patterned photoresist may be removed after the pattern has been transferred into the blanket layer of gate conductor 24.

Suitable dry etching processes that can be used in the present invention in forming the patterned gate stacks include, but are not limited to: reactive-ion etching, ion beam etching, plasma etching or laser ablation. A wet or dry etching process can also be used to remove portions of the gate dielectric 22 that are not protected by the patterned gate conductor 24.

Next, an offset spacer 26 is formed on exposed sidewalls of each patterned gate stack. The offset spacer 26 is comprised of an insulator such as an oxide, nitride, oxynitride, or carbon-containing silicon oxide, nitride, oxynitride, and/or any combination thereof. Preferably, the offset spacer 26 is comprised of an oxide or an oxynitride. The offset spacer 26 can be formed by deposition and etching or by thermal techniques. The width of the offset spacer, as measured at the surface of substrate 12, is narrower than that of the outer spacers 28 to be subsequently formed. Typically, offset spacer 26 has a width from about 2 to about 100 nm, with a width from about 5 to about 15 nm being even more typical.

After providing the offset spacer 26, source/drain extension regions 18 are formed utilizing a conventional extension ion implantation process. An optional anneal process may follow the extension ion implant. In some embodiments, a halo implant (not shown) can be formed at this point of the inventive process utilizing a conventional halo ion implantation process.

Next, at least one outer spacer 28 which is comprised of a different insulating material as the offset spacer 26, preferably a nitride, is formed by deposition and etching. The at least one outer spacer 28 must be sufficiently wide enough such that the source and drain silicide contacts (to be subsequently formed) do not encroach underneath the edges of the gate stack. Typically, the source/drain silicide contacts does not encroach underneath the edges of the gate stack when the at least one outer spacer 28 has a width, as measured at the bottom, from about 15 to about 200 nm.

After outer spacer 28 formation, source/drain diffusion regions 16 are formed into the substrate 12. The source/drain diffusion regions 16 are formed utilizing ion implantation and an annealing step. The annealing step serves to activate the dopants that were implanted by the previous implant step (or steps if annealing was not previously been performed to activate the dopants within the extension implant regions). At this point of the present invention, a buffer implant may be performed to provide the source/drain regions with a graded junction that optimizes the series resistance of the device.

In some embodiments of the present invention and when the substrate 12 does not include silicon, a Si-containing layer can be formed atop of the exposed portions of the substrate 12 to provide a source for forming the silicide contacts. Illustrative examples of Si-containing materials that can be used include, for example, Si, single crystal Si, polycrystalline Si, SiGe, and amorphous Si. This embodiment of the present invention is not illustrated in the drawings.

Next, the source/drain diffusion regions 14 and optionally the gate conductor 24 are silicided utilizing a standard salicidation ('self-aligned') process well known in the art. This includes forming a metal capable of reacting with Si atop the entire structure, forming a barrier layer atop the metal, heating the structure to form a silicide, removing non-reacted metal and the barrier layer and, if needed, conducting a second heating step. The second heating step is required in those instances in which the first heating step does not form the lowest resistance phase of the silicide. In FIG. 1, reference numeral 30 denotes the silicided source/drain regions. Note that if the gate conductor 24 is comprised of polysilicon or SiGe and no dielectric cap is present, this step of the present can be used in forming a metal silicide 32 atop the gate conductor 24. The latter embodiment is specifically shown in the drawings of the present application.

Figure 2:
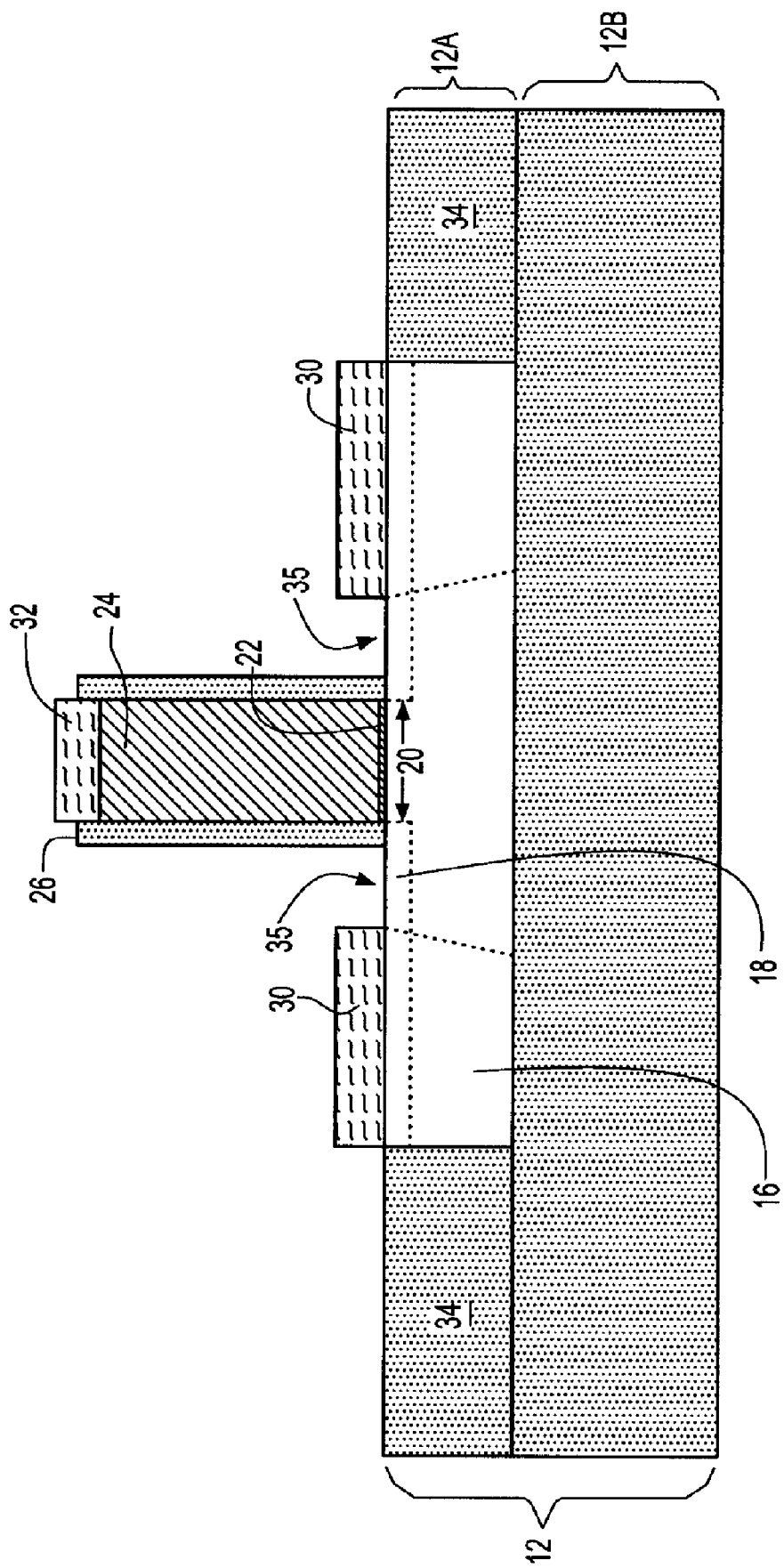
FIG. 2 is a pictorial representation (through a cross sectional view) depicting the MOS structure of FIG. 1 after removing the outer spacer from the structure.

Next, and as illustrated in FIG. 2, the outer spacer 28 is removed from the structure utilizing an isotropic etching process that selectively removes the outer spacer 28, without substantially removing offset spacer 26. It is noted that this selective etching step is dependant on the compositions of the outer spacer 28 and the offset spacer 26. For example, when the outer spacer 28 is comprised of a nitride, and the offset spacer 26 is comprise of an oxide or oxynitride, HF can be used in removing the nitride outer spacer. Alternatively, and in the specific embodiment illustrated, a dry etching process such as reactive-ion etching containing a gas including F, O, C and N atoms in He can be used in removing the outer nitride spacer 28. As shown in FIG. 2, the removal of the outer spacer 28 exposes a surface portion of the semiconductor substrate 12 including the source/drain extension regions 18. The exposed surface portion is labeled as 35 in FIG. 2.

Figure 3:
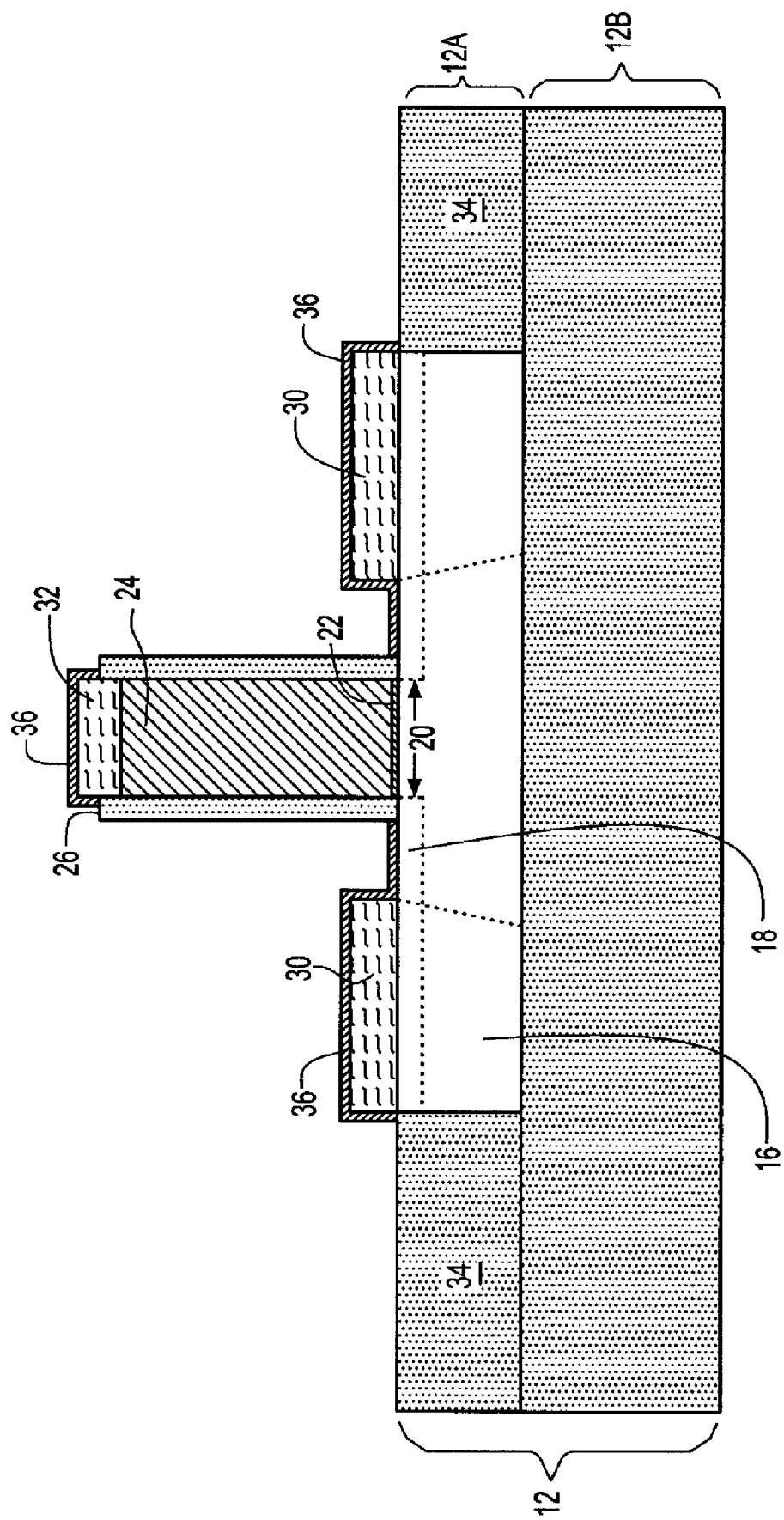
FIG. 3 is a pictorial representation (through a cross sectional view) depicting the MOS structure of FIG. 2 after performing a selective plating process in which a metallic or intermetallic material is formed at least over exposed portions of the source/drain extension regions.

FIG. 3 shows the structure of FIG. 2 after performing a selective plating process which forms a metallic or intermetallic material 36 on the exposed surface portions 35 of at least the source/drain extension regions 18 and optionally on the silicide contacts 30 and 32. The selective plating process is performed utilizing plating techniques that are well known in the art. For example, both electroplating and electroless plating are contemplating herein. Preferably, the plating technique used in the present invention comprises electroless plating.

Metal deposition by electroless plating is well practiced in industry. In electroless deposition process, a redox reaction involving the oxidation of one or more soluble reducing agent(s) and the reduction of one or more metallic ions occurs on the surface of a substrate. For many metals including Cu, Ni, Co, Au, Ag Pd, Rh, the freshly deposited surface is sufficiently catalytic for the process to continue. To begin the process, however, the substrate is first seeded with a thin layer of catalytic material such as palladium to initiate the electroless deposition. More commonly, the substrate is primed with a palladium ion containing solution. Palladium ion undergoes an immersion exchange reaction with the substrate leading to formation of a thin layer (1 to a few mono layer thick) of palladium. For example, for plating of CoWP over copper features in a semiconductor device, the wafer is primed with a dilute solution of palladium acetate. Palladium ions reacted with copper and reduced to palladium metal while the Coulombic equivalent amount of copper was etched out as copper ions. Wafer is well rinsed with water containing complexing agent such as EDTA to remove extraneous palladium to avoid bridging in subsequent plating. Background information on electroless plating are well documented in Industrial Electrochemistry—D. Pletcher and F. C. Walsh (Editor), $2^{nd}$ Edition, Chapman and Hall, NY 1990, ISBN: 0412304104 and Electroless Plating: Fundamentals and Applications—G. O. Mallory, J. B. Hajdu (Editor) 1990, ISBN: 0815512775.

Palladium seeding by immersion displacement works only on substrate with features that are active to undergo an exchange reaction with the palladium ion in solution. In principle, selective plating is achieved by prior defining the area to be plated with a suitable material such as copper, then apply a suitable seeding followed by plating, as exemplified in U.S. Pat. No. 4,877,644 where the general area is masked with polymeric plating resist, followed by selective removal of resist at a selective area to expose the underlying metal and finished with electroless plating. An alternative approach is to do selective seedling by forming defined features of palladium or other seeding material first upon which electroless plating is taken place. "Selective Plating of Copper for Circuitzation of Teflon and Epoxy based Substrates", T. H. Baum et al., Proceedings of Electrochemically Deposited Thin Films II, Fl, USA, 1994, p 320-7 provides a technique to incorporate potassium iron (III) oxalate in the presence of palladium(II) chloride and selectively forming palladium metal features upon which metal conduction are plated by exposure to UV light. U.S. Pat. No. 5,260,108 describes selective seeding using an excimer laser radiation. A circuit repair technique using laser to heat up a local area to accelerate palladium seeding leading to selective copper plating was documented in "Circuit Repair Using Palladium Seeding and Selective Electroless Plating ", Vigliotti, D R et al., IBM Technical Disclosure Bulletin, v37 n6B 06-94 p 443-444.

Another example of using photoexcitation to modified a surface to achieve selective plating is mentioned in "Development of Photoexcited Surface Modification Technology Utilizing Modulator Radiation", Y. Tsutsui et al., Sumitomo Electric Industries Tech. Rev. (Japan), No. 45, January 1998, p 169-74.

In electroless plating, activation of a surface, non conductive, or semiconductor can be achieved by the incorporation onto the top surface layer of nanometer sized catalytic particles. These catalytic particles can be either Pd, Co, Ni, and they can be applied by a either physical or chemical deposition.

The function of these particles is to catalyze and initiate the electrochemical deposition reaction when the substrate is immersed into an electroless plating bath. The electroless plating bath deposits a conductive layer on the catalyzed area of the substrate, the thickness of the plating layer depending mainly on the time of exposure to the plating bath. A suitable electroless plating system used in this invention is based on the use of the hypophosphite reducing agent. In this system, a mixture of hypophosphite ions and cobalt or nickel ions is made together with citrate stabilizing agent, at a suitable pH and temperature (usually between 65° to 75° C.). When the activated catalyzed substrate described above is immersed on this plating bath, the following reaction occurs on the substrate:

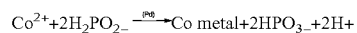

The Co metal is then deposited selectively on top of the catalyzed Pd layer on the substrate. The metal deposited by this reaction, can be either CoP, or NiP, or CoWP, or NiWP, CoB or NiB or CoWB, depending on the composition of the plating bath solution. The catalytic layer can be either Pd, or Ni or Co metal. The catalytic Pd layer can be incorporated on the surface of the substrate either by ion implantation, or other type of physical deposition method, or it can be applied by chemical means. For example, a colloidal Pd catalytic solution containing microparticles of Pd in suspension can be injected in the inside of the trench cavity and it will deposit the Pd particles with very good adhesion onto the inside of the trench wall. To make the catalytic process selective, in a later step as described below, the catalytic layer is removed selectively from unwanted areas.

As stated above, the selective plating process forms a metallic or intermetallic material 36 on the locations previously mentioned. The metallic or intermetallic material 36 comprises a low-resistance material such as, for example, W, Al, Cu, Au, Pt, Pd, Ni, Co, Re, Rh, Ag, TiN, Ti, TaN, WN or alloys, including silicon-containing alloys thereof. In one embodiment of the present invention, the metallic or intermetallic material 36 comprises CoWP. By 'low-resistance', it is meant that material 36 has a resistivity that provides an extension connection having a resistance of less than 50 ohms/square. The thickness of the metallic or intermetallic material 36 may vary depending on the conditions used for plating the same. Typically, the metallic or intermetallic material 36 has a thickness from about 1 to about 20 nm, with a thickness from about 2 to about 5 nm being more typical. The metallic or intermetallic material 36 located above the exposed portions 35 of the extension regions 18 forms a low-resistance extension connection between the MOSFET channel and the silicided contacts 30 located above the source/drain regions 16, i.e., the silicided source/drain regions.

Figure 4:
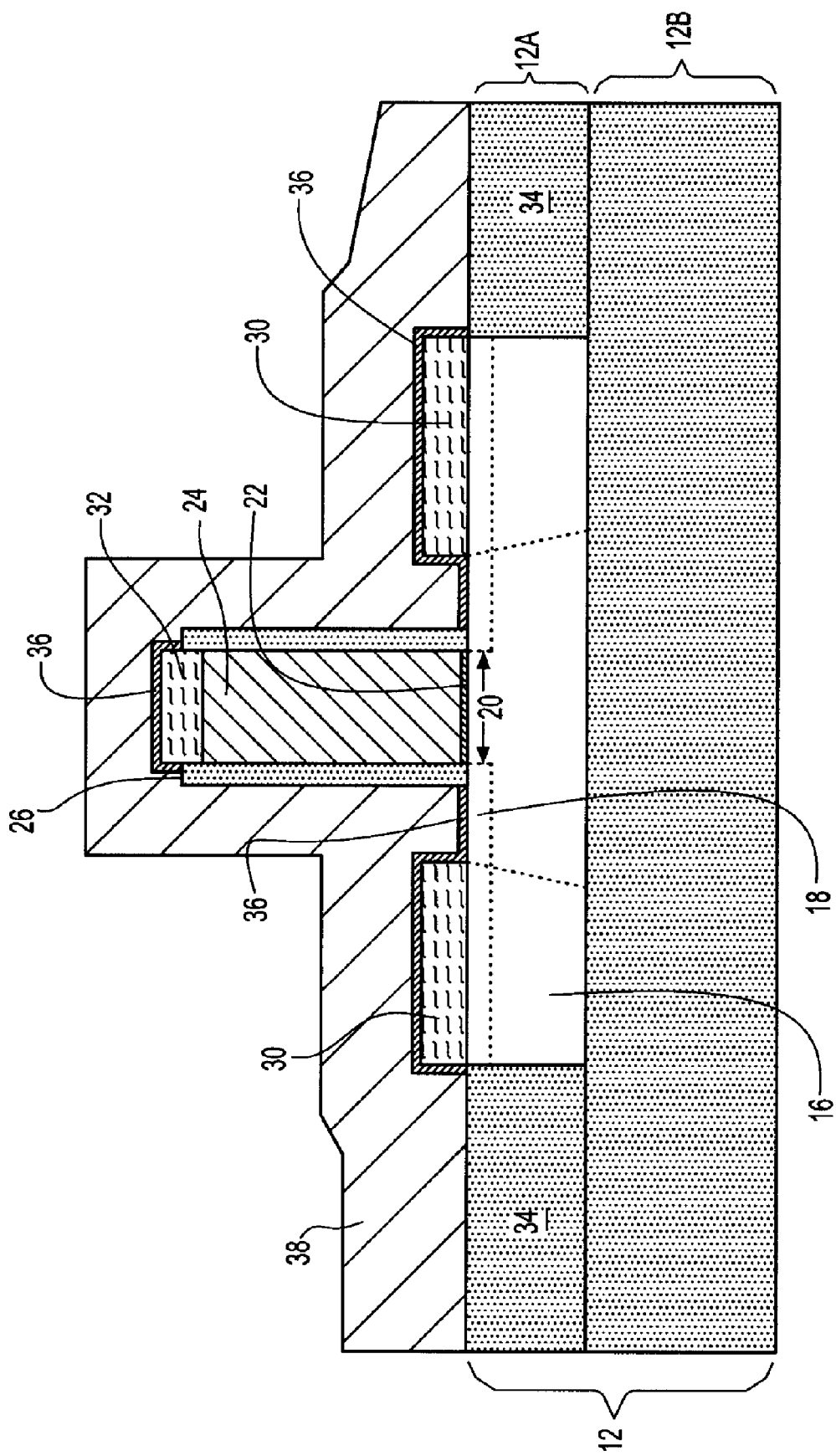
FIG. 4 is a pictorial representation (through a cross sectional view) depicting the MOS structure of FIG. 3 after forming an optional stress-inducing liner over the structure.

FIG. 4 shows the structure after forming a liner 38 over the structure shown in FIG. 3. The liner 38 is optional and is not required in all instances. The liner 38 is formed by a conventional deposition process such as, for example, chemical vapor deposition, plasma enhanced chemical vapor deposition, chemical solution deposition, evaporation and other like deposition processes. The liner 38 is comprised of a material that is capable of introducing stress into the channel region of the structure. For example, liner 38 may be comprised of a nitride that is under either tensile or compressive stress. The liner 38, when present, typically has a thickness from about 10 to about 500 nm, with a thickness from about 10 to about 50 nm being even more typical.

At this point of the present invention conventional back-end-of-the-line (i.e., interconnect) technology can be used in forming contacts to the silicided source/drain regions and optionally the silicided gate conductor.

Although specific mention of the above processing is made, the present invention can also be implemented into a replacement gate process by first providing the structure shown in FIG. 1 by a conventional replacement gate process and then following the description provided for FIGS. 2-4.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a semiconductor substrate including source/drain extension regions, a channel region located between said source/drain extension regions and source/drain regions;
a gate dielectric and a gate conductor located above the channel region and positioned on a surface of said semiconductor substrate, said gate dielectric and said gate conductor having vertical edges that are covered by an offset spacer;
silicide source/drain contacts located directly on and above source/drain regions; and
a metallic or intermetallic material portion that includes at least a first portion, a second portion, and a third portion that are contiguous to one another and have a same material composition, wherein said first portion laterally abuts a lower portion of said offset spacer and a surface of said source/drain extension regions, said second portion laterally abuts a sidewall of said silicide source/drain contacts, and said third portion vertically abuts a top surface of said silicide source/drain contacts, wherein said silicide source/drain contacts are spaced apart from said channel region by said metallic or intermetallic material portion, and wherein said metallic or intermetallic material portion does not cover the entirety of said offset spacer.

2. The semiconductor structure of claim 1, wherein said semiconductor substrate is a bulk semiconductor.

3. The semiconductor structure of claim 1 wherein said semiconductor is a semiconductor-on-insulator.

4. The semiconductor structure of claim 1 wherein said metallic or intermetallic material portion is comprised of W, Al, Cu, Au, Pt, Pd, Ni, Co, Re, Rh, Ag, TiN, Ti, TaN, WN or alloys thereof.

5. The semiconductor structure of claim 1 wherein said metallic or intermetallic material portion is comprised of CoWP.

6. The semiconductor structure of claim 1 wherein said metallic or intermetallic material portion provides an extension connection having a resistance of less than 50 ohms/square.

7. The semiconductor structure of claim 1 wherein said gate conductor further comprises an upper region including a silicide.

8. The semiconductor structure of claim 1 further comprising a liner that introduces stress into said channel region, said liner is located over said semiconductor substrate including said suicide source/drain contacts, said metallic or intermetallic material portion, said gate dielectric and said gate conductor.

9. The semiconductor structure of claim 1 wherein said metallic or intermetallic material portion does not comprise a metal silicide.

10. The semiconductor structure of claim 9 wherein said metallic or intermetallic material portion does not comprise silicon.

11. The semiconductor structure of claim 1 wherein said metallic or intermetallic material portion has a thickness from about 1 to about 20 nm.

12. The semiconductor structure of claim 1, wherein said metallic or intermetallic material portion is an electrolessly platable material.

13. The semiconductor structure of claim 12 wherein said metallic or intermetallic material portion includes an electrolessly plated elemental metal or an electrolessly plated intermetallic alloy.

14. The semiconductor structure of claim 1, wherein said metallic or intermetallic material portion comprises a different material than said silicide source/drain contacts.

15. The semiconductor structure of claim 4 wherein said metallic or intermetallic material portion consists of W, Al, Cu, Au, Pt, Pd, Ni, Co, Re, Rh, Ag, TiN, Ti, TaN, WN or alloys thereof.

16. The semiconductor structure of claim 5 wherein said metallic or intermetallic material portion consists of CoWP.

* * * * *